United States Patent [19]
Chittipeddi et al.

[11] Patent Number: 5,751,065
[45] Date of Patent: May 12, 1998

[54] INTEGRATED CIRCUIT WITH ACTIVE DEVICES UNDER BOND PADS

[75] Inventors: Sailesh Chittipeddi, Austin, Tex.; William Thomas Cochran, Clermont, Fla.; Yehuda Smooha, South Whitehall Township, Lehigh County, Pa.

[73] Assignee: Lucent Technologies Inc., Murray Hill, N.J.

[21] Appl. No.: 549,990

[22] Filed: Oct. 30, 1995

Related U.S. Application Data

[63] Continuation-in-part of Ser. No. 102,434, Aug. 5, 1993, abandoned.

[51] Int. Cl.⁶ .................................................. H01L 23/48
[52] U.S. Cl. .......................... 257/758; 257/773; 257/786
[58] Field of Search ............................ 257/774, 776, 257/773, 775, 786, 758

[56] References Cited

U.S. PATENT DOCUMENTS

| 4,636,832 | 1/1987 | Abe et al. ............................... 357/68 |
| 4,984,061 | 1/1991 | Matsumoto ............................. 257/786 |
| 5,502,337 | 3/1996 | Nozaki .................................... 257/774 |

FOREIGN PATENT DOCUMENTS

| 0100100 | 7/1983 | European Pat. Off. . |
| 0418777A2 | 9/1990 | European Pat. Off. ...... H01L 23/485 |
| 57-79940 | 11/1983 | Japan ............................. H01L 21/60 |
| 61-64147 | 4/1986 | Japan . |

OTHER PUBLICATIONS

"A New Integration Technology that Enables Forming Bonding Pads on Active Areas" K. Nukai, A. Hiraiwa, S. Muramatsu, I. Yoshida, and S. Harada, Central Research Laboratory, Hitachi, Ltd., Kukubunji, Tokyo 185, Japan.

Primary Examiner—Tom Thomas
Assistant Examiner—Roy Potter
Attorney, Agent, or Firm—John T. Rehberg

[57] ABSTRACT

Active circuitry is placed under the bond pads in an integrated circuit having at least three metal levels. The metal level adjacent the bond pad level acts as a buffer and provides stress relief and prevents leakage currents between the bond pad and underlying circuitry.

11 Claims, 3 Drawing Sheets

1

INTEGRATED CIRCUIT WITH ACTIVE DEVICES UNDER BOND PADS

CROSS-REFERENCE TO RELATED APPLICATION

This application is a continuation-in-part of application Ser. No. 08/102,434 (S. Chittipeddi 13-8) filed Aug. 5, 1993, now abandoned.

TECHNICAL FIELD

This invention relates generally to the field of integrated circuits and particularly to such integrated circuits in which at least a portion of the active circuitry is positioned under the bond pads.

BACKGROUND OF THE INVENTION

Although much public attention is given to aspects of integrated circuit technology, such as the number or dimensions of devices in the circuit and their operating speeds, because progress in these aspects has great public appeal, other aspects of integrated circuit technology are of equal importance to progress within the field of integrated circuits. For example, integrated circuits must be electrically contacted. The electrical connection from the external pins of the integrated circuit package to the integrated circuit goes through bond pads which are located on the periphery of the integrated circuit. The bond pads are metal areas which are electrically connected to the devices in the integrated circuit via buffers and electrically conducting interconnects. Due to conventional bonding technology used to, for example, attach wires to the bond pads and to design constraints, the bond pads have relatively large dimensions as compared to the device dimensions and occupy or cover a significant portion of the chip surface. The area underneath the bond pads thus occupies a substantial fraction of the entire chip surface.

The electrical connection between the package and the bond pad requires physical integrity as well as high electrical conductivity. The conventional bonding process used to form the connection typically requires either or both elevated temperatures, high pressures and ultrasonic energy to produce a good connection between the wire and the bond pad. If the bond pad is on a dielectric, the bonding conditions produce mechanical stresses in the dielectric. The stress may cause defects which result in leakage currents through the dielectric between the bond pads and the underlying substrate, which is frequently electrically conducting. The leakage currents preclude use of the substrate area under the bond pads for device purposes thereby decreasing the efficiency of substrate utilization for device purposes. Input and output buffers are typically located on the periphery of the integrated circuit and between bond pads to avoid placement under the bond pads; the spacing between bond pads must be increased to accommodate the buffers or other devices.

Attempts have been made to use the substrate under the bond pads for active device purposes. Attempts have been made using conventional wire bonding technology. For example, Mukai et. al. in IEDM, pp. 62-65, 1981, reported the use of an interlevel dielectric layer between the bond pads and active circuitry to absorb stresses produced by the bonding process. Several dielectric materials were reported. Additionally, Haruta et. al. reported in Japanese patent JP 58197735 the use of a metal layer to absorb the stresses produced during bonding. It is stated that magnesium is added to the aluminum to strengthen the aluminum and prevent stresses from passing through to the dielectric, and that no cracks were generated in the dielectric. However, if there are defects in the dielectric, current may flow through the dielectric to the active devices.

SUMMARY OF THE INVENTION

According to an exemplary embodiment of this invention, an integrated circuit is fabricated with active circuitry underneath the bond pads. There is a plurality of patterned metal layers between the bond pads and the semiconductor layer with the active devices. There are dielectric layers between the patterned metal layers and the metal layers and the bond pads and the active circuitry. The metal layer nearest the bond pads shields and protects the devices from the stress produced during the bonding process. This metal layer is patterned to form metal regions that are substantially over the active devices and which may be electrically isolated from the integrated circuit. The active devices may be, for example, input/output buffers. The electrical connections between the bond pads and the active circuitry are made through windows in the dielectric layers, between the bond pads and the active devices, which expose portions of the active circuitry and are filled with metal. In a preferred embodiment, the integrated circuit has at least three metal levels.

DETAILED DESCRIPTION

Figure 1:
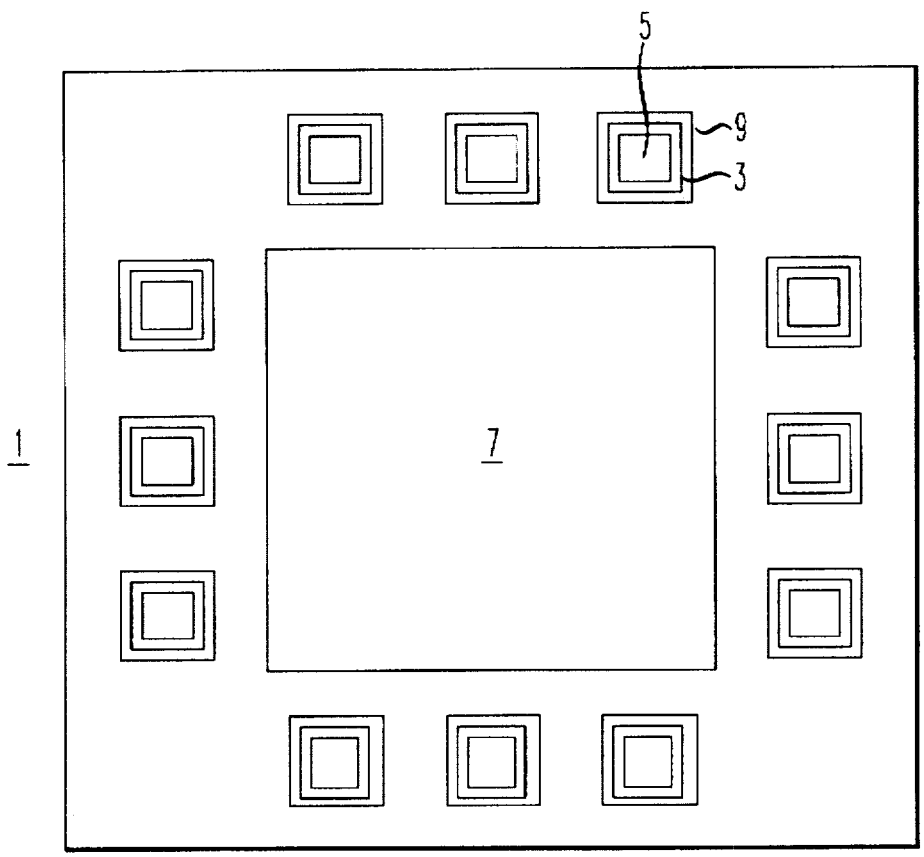
FIG. 1 is a top view of a portion of an integrated circuit according to this invention.

A top view of a portion of an integrated circuit according to this invention is depicted in FIG. 1. Depicted is integrated circuit chip 1, a plurality of metal bond pads 3, and a dielectric layer which is over the entire chip 1, but has been patterned to expose portions 5 of the metal bond pads 3. The bond pads 3 are formed on the integrated circuit. The primary portion 7 of the integrated circuit is formed in the center of the chip, but the integrated circuit has active devices, for example, input/output buffers, underneath the bond pads 3. There are dielectric layers between the bond pads and a metal layer; and between the metal layers and the active devices. At least one of the metal layers has been patterned to cover the region 9 underneath the bond pads 3 and over active device areas (not shown). The other layers, both metal and dielectric, are not shown for reasons of clarity. The metal layer nearest the bond pad provides the stress relief needed so that the integrity of the intervening dielectric layers is not destroyed during the bonding process. Even if the dielectric between the bond pad and the metal layer nearest the bond pad develops defects during the bonding process, the leakage current stops at the metal layer. The area underneath the bond pads may thus be used for active devices without fear of excessive leakage currents through the dielectric layers. The ability to position active devices underneath the bond pads permits the bond pads to be more closely spaced to each other and thereby allows more bond pads per linear peripheral distance. Furthermore, positioning of active devices under the bond pads is a more efficient use of silicon and therefore facilitates a larger number of dice per wafer.

Figure 2:
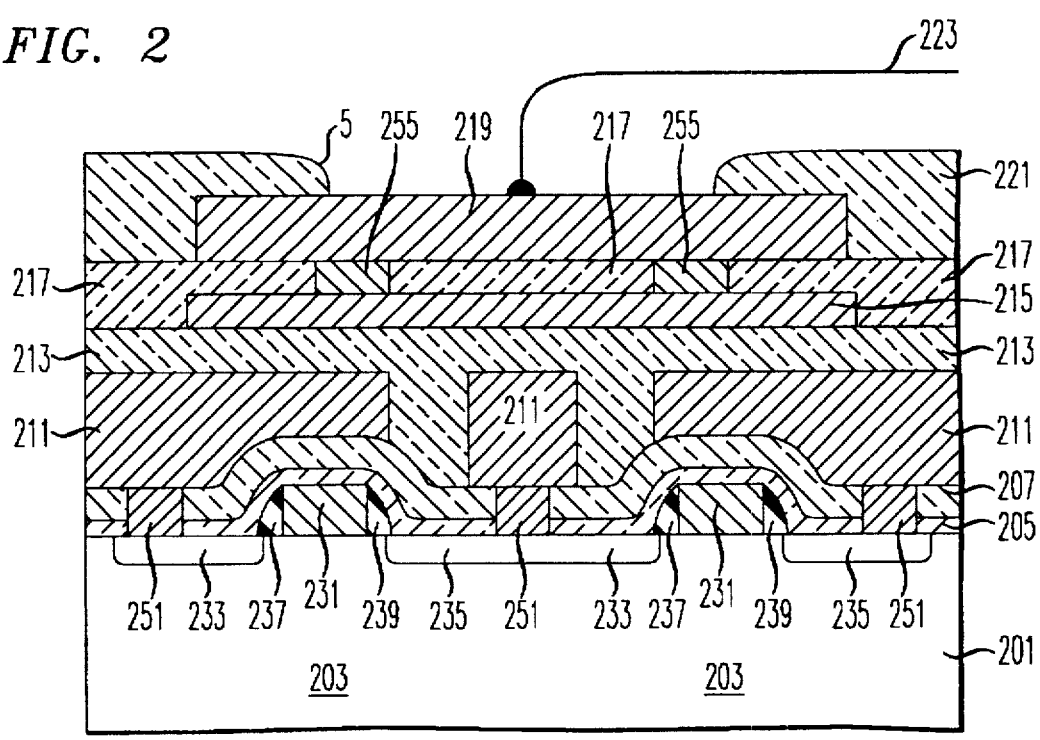
FIGS. 2-3 are sectional views of a portion of the integrated circuit according to this invention depicted in FIG. 1.

The structure of the integrated circuit is better understood by reference to FIG. 2 which is a sectional view of an integrated circuit according to this invention. A portion of the periphery including the bond pad, metal and dielectric layers and active devices under the bond pad is illustrated. Depicted are substrate 201, devices 203, first dielectric layer 205, second dielectric layer 207, first metal layer 211, third dielectric layer 213, second metal layer 215, fourth dielectric layer 217, third metal layer 219, and fifth dielectric layer 221. There is dielectric material 217 between layers 213 and 217. Wire 223 has been bonded to third metal layer 219 which forms bond pad 9. Second metal layer 215 has been patterned so that a portion underlies the bond pads and covers at least portions of the devices 203. Windows 251 and 255 in dielectric layers 205 and 207 and 217, respectively, provide electrical connections between substrate 1 and metal layer 211, and metal layers 215 and 219, respectively. Second metal layer 215 provides the stress relief during the bonding process that prevents the dielectric layers from cracking. If dielectric layer 217 develops defects during bonding, leakage currents do not flow to the substrate because of the pressure of the metal layer.

Certain features described generally in the preceding paragraph merit more comment and detail. The device 203 depicted is a field effect transistor having a gate structure 231, source/drain regions 233 and 235 on opposite sides of gate structure 231, and insulating sidewalls 237 and 239 on opposite sides of the gate structure 231. Gate structure 231 is formed from polysilicon. Insulating portions of the gate structure, such as the gate oxide, are well known and used not be depicted. First and second dielectric layers 207 and 209 are conformal dielectrics such as TEOS and BPTEOS, respectively. Other dielectric layers can also be formed from well known deposited oxides or nitrides. The metal layers may be aluminum. Additives, such as silicon, may be present in minor amounts. As shown, a portion of the integrated circuit, including active devices such as field effect transistor 203, is formed directly under the bond pad.

The structure depicted will be readily fabricated by those skilled in the art using known techniques. Well known techniques may be used to deposit and pattern the dielectric and metal layers and to form the device. For example, well known lithographic, ion implantation, etching, etc., processes may be used. Detailed description of suitable processes is therefore not required. The details of the integrated circuit will depend upon the applications desired for the integrated circuit. The integrated circuit will be relatively complex, at least by the standards used at the present time, to warrant the use of multilevel metal interconnects. The packaging connection to the bonding pad is done by any of the conventional and well known techniques presently used.

Metal layer 215 may be patterned so that it is smaller than depicted and a window goes directly from the bond pad to the active devices. Layer 215 is then electrically isolated (except for stray capacitance) from the remainder of the integrated circuit. The window is filled with metal using now conventional techniques. This embodiment is desirable because it permits the dielectric layers to be thicker than in the previously described embodiment. Thicker dielectric layers are less likely to crack than are thinner layers.

That the area underneath the bond pads could be used for device purposes was determined by measuring capacitor leakage through a dielectric layer under various bonding conditions. The bonding process stresses the dielectric layer between two metal layers; defects in the dielectric may be produced which result in leakage currents between the metal layers. However, we found that in integrated circuits with three or more levels of metal, the second or higher level or metal can provide stress relief from crack propagation in the dielectric caused by the bonding process.

Variations in the embodiment depicted will be readily thought of by those skilled in the art. Although an embodiment with three metal layers has been described, more metal layers may be present. Additionally, the bond pads need not be on the periphery of the integrated circuit. Furthermore, the bond pads need not be electrically connected to the metal layer immediately underneath.

Figure 3:
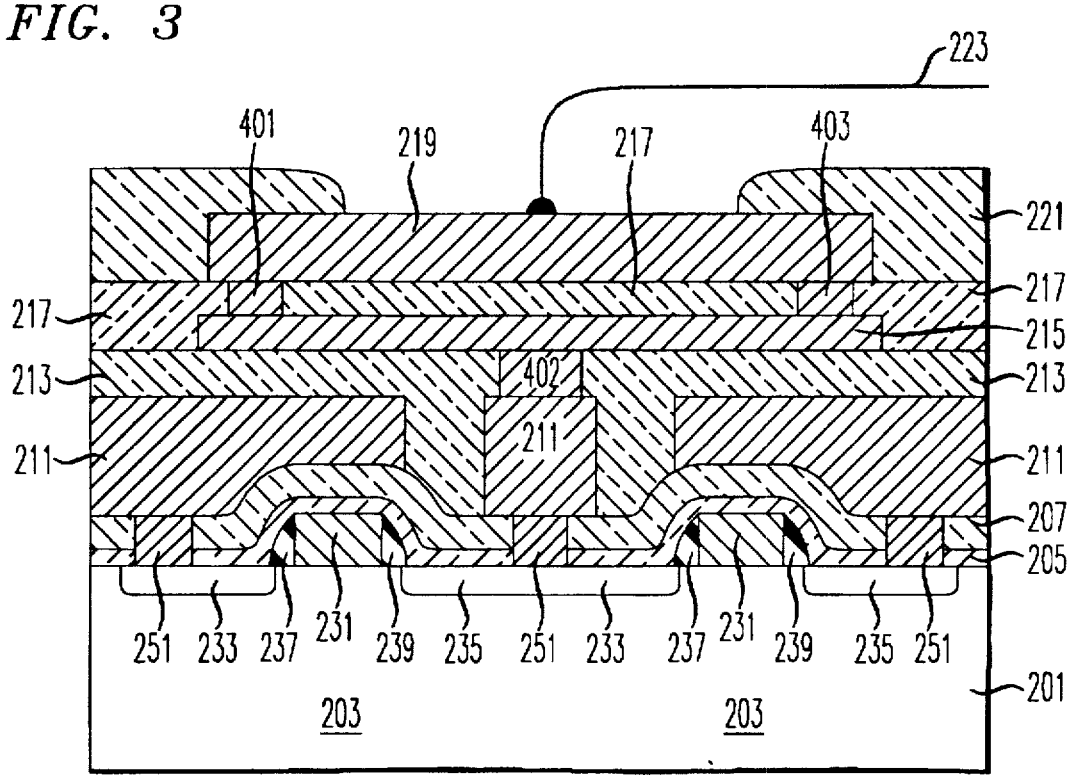

In the embodiment of FIG. 3, it will be noted that windows 401 and 403 are positioned beneath dielectric 221. (By contrast, in FIG. 2 windows 255 are depicted as being positioned beneath opening 5 in dielectric 221.) The embodiment of FIG. 3 prevents damage to the windows during probing or wire bonding. Furthermore, the embodiment of FIG. 3 also contains window 402 which connects metal layer 215 and metal layer 211.

Figure 4:
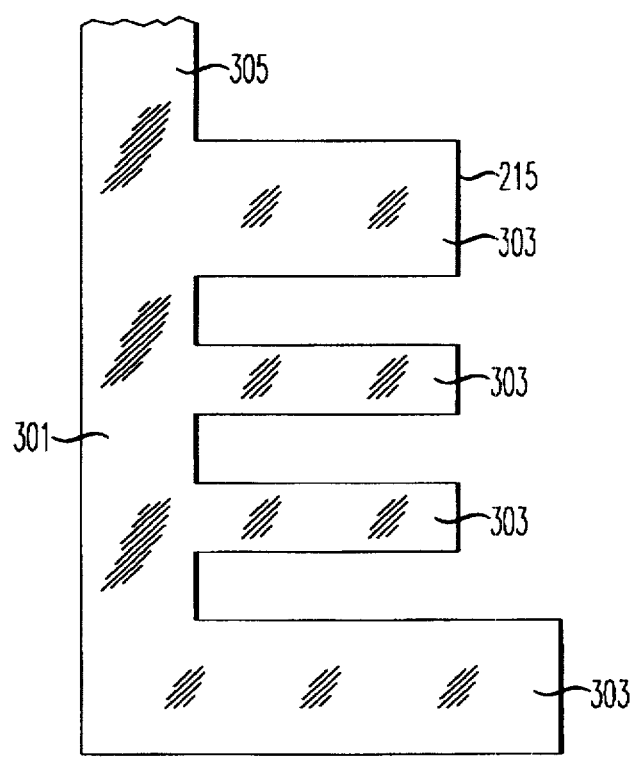
FIGS. 4-6 are top views of various embodiments of a portion of an integrated circuit according to this invention. For reasons of clarity, the elements depicted are not drawn to scale.

Metal layer 215 may also be patterned beneath bond pad 219 to provide further stress relief. In FIG. 4, metal layer 215 has been patterned so that it has a plurality of fingers 303 attached to spine 301. An extension 305 of spine 301 provides electrical connection to portions of the circuit which are not under bond pad 219.

Figure 5:
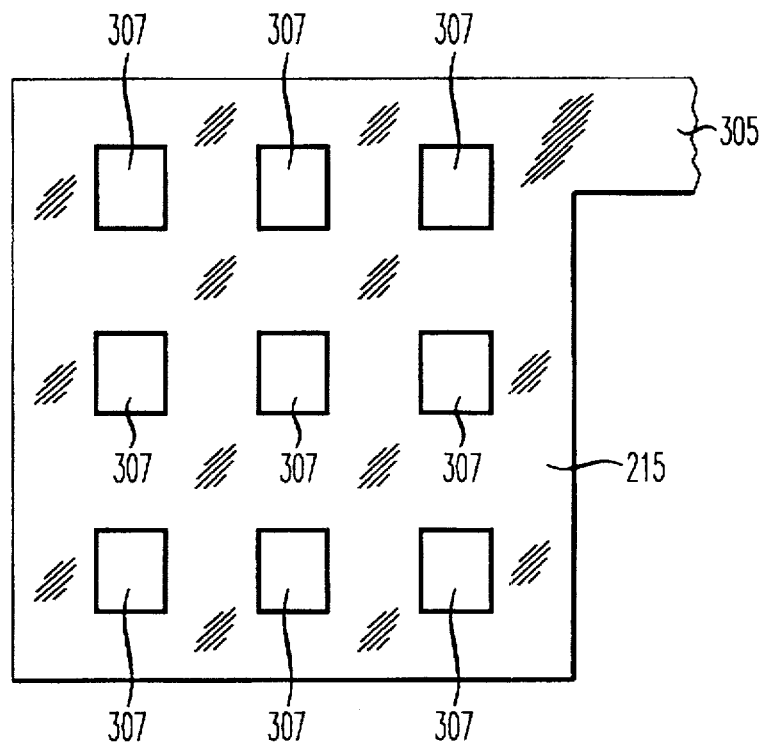

In the embodiment of FIG. 5, metal layer 215 has openings 307 which provide stress relief. Extension 305 provides electrical connection to portions of the circuit which are not under bond pad 219.

Figure 6:
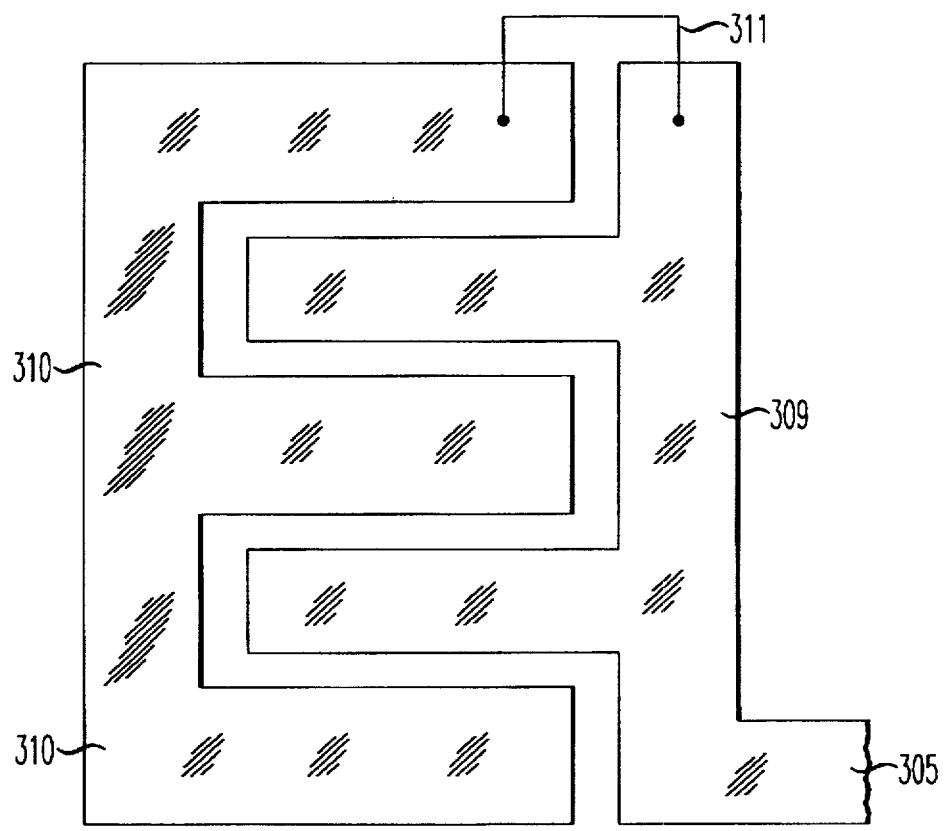

In the embodiment of FIG. 6, a pair of interdigitated, comb-like structures 309 and 310 comprise metal layer 215. Structures 309 and 310 are electrically connected by conductor 311. Extension 305 provides electrical connection to portion of the circuit which are not under bond pad 219.

We claim:

1. An integrated circuit comprising:

a substrate;

active devices formed on the surface of said substrate;

a bond pad formed substantially over a portion of said active devices, said bond pad having a footprint;

a patterned metal layer having a footprint and located between said bond pad and said substrate, said metal layer being substantially over said active devices, said footprint of said bond pad substantially overlying said footprint of said patterned metal layer;

a first dielectric layer separating said patterned metal layer from said bond pad, said patterned metal layer being electrically isolated from said active devices by a second dielectric layer; and electrical connections from said bond pad to said active device and from said patterned metal layer to said bond pad or said active devices.

2. An integrated circuit as recited in claim 1 in which said patterned metal layer is electrically connected to said bond pad.

3. An integrated circuit as recited in claim 2 in which said patterned metal layer is electrically connected to at least one device of said active said devices under said bond pad.

4. An integrated circuit as recited in claim 1 in which said integrated circuit has three metal levels.

5. An integrated circuit as recited in claim 1 in which said integrated circuit has at least four metal levels.

6. An integrated circuit comprising:

a substrate;

active devices formed on the surface of said substrate;

a plurality of bond pads, at least one of said bond pads being substantially over at least one of said active devices, said bond pad having a footprint;

a patterned metal layer having a footprint and located between each of said plurality of bond pads and said substrate, at least a portion of said metal layers being substantially over at least one of said active devices, each of said metal layers being electrically isolated from said active devices by a first dielectric material, said footprint of said bond pad substantially overlying said footprint of said patterned metal layer;

a second dielectric material separating each of said patterned metal layer from said bond pads, each of said patterned metal layers forming a barrier between said first dielectric material and said active devices that substantially prevent current leakage between said second dielectric material and said active devices; and electrical connections from said bond pads to said active devices.

7. An integrated circuit as recited in claim 6 further comprising a metal layer between said patterned metal layer and said active devices; said metal layer being separated from said active devices and said patterned metal layer by dielectric material.

8. The circuit of claims 1 or 6 in which said patterned metal layer beneath said bond pad has a plurality of openings.

9. The circuit of claims 1 or 6 in which said patterned metal layer beneath said bond pad has a plurality of areas extending from a spine.

10. The circuit of claims 1 or 6 in which said patterned metal layer beneath said bond pad has two electrically connected interdigitated combs.

11. The circuit of claim 1 or 6 in which the said patterned metal layer beneath said bond pad is electrically connected to said bond pad by window, and in which a dielectric covers a portion of said bond pad and in which said windows are beneath said dielectric.

\* \* \* \* \*